United States Patent [19]
Regier

[11] Patent Number: 6,140,859
[45] Date of Patent: Oct. 31, 2000

[54] ANALOG SWITCH COMPRISING CONNECTED BIPOLAR JUNCTION TRANSISTORS

[75] Inventor: Christopher G. Regier, Cedar Park, Tex.

[73] Assignee: National Instruments Corporation, Austin, Tex.

[21] Appl. No.: 09/148,264

[22] Filed: Sep. 4, 1998

[51] Int. Cl.$^7$ .................................................. H03K 17/60
[52] U.S. Cl. ........................................... 327/478; 327/482
[58] Field of Search ................................... 327/382, 403, 327/405, 407, 411, 425, 426, 419, 436, 478, 482, 489

[56] References Cited

U.S. PATENT DOCUMENTS

| | | | |
|---|---|---|---|
| 3,024,369 | 3/1962 | Royer | 307/88.5 |
| 3,254,240 | 5/1966 | Lambourn | 307/88.5 |
| 3,346,698 | 10/1967 | Bradford | 179/15 |
| 3,378,700 | 4/1968 | Stewart | 307/254 |
| 3,453,451 | 7/1969 | Orrell, Jr. | 307/254 |
| 3,515,905 | 6/1970 | Raper | 307/254 |
| 5,617,055 | 4/1997 | Confalonieri et al. | 327/404 |

OTHER PUBLICATIONS

Rohm Co. Ltd., Discrete Components Databook, 1990 edition, p. 582.
Schematic of the NI–5102, a product that was released by National Instruments Apr. 1, 1997, 1 page.
Paul Horowitz and Winfield Hill, "The Art of Electronics," 2$^{nd}$ edition,(Cambridge University Press, 1989), pp. 142–143.

*Primary Examiner*—Jeffrey Zweizig
*Attorney, Agent, or Firm*—Conley, Rose & Tayon PC; Jeffrey C. Hood

[57] ABSTRACT

An analog switch is constructed using two bipolar junction transistors. The emitter of the first transistor is coupled to the emitter of the second transistor, and preferably the base of the first transistor is coupled to the base of the second transistor. The collectors of the transistors form the terminals of the analog switch. A current source is coupled to the bases of both transistors. The current source produces a drive current sufficient to forward bias the base-emitter junctions of both transistors. In this forward biased state, the collector of the first transistor and the collector of the second transistor are electrically coupled. A bias voltage source is coupled via a switch to the bases of both transistors. The bias voltage source produces a voltage sufficient to reverse bias the base-collector junctions of both transistors. In this reverse biased state, the electrical connection between the collector of the first transistor and the collector of the second transistor is broken.

39 Claims, 2 Drawing Sheets

ANALOG SWITCH COMPRISING CONNECTED BIPOLAR JUNCTION TRANSISTORS

FIELD OF THE INVENTION

The present invention relates to analog switching, and in particular to an analog switch using two bipolar junction transistors.

DESCRIPTION OF THE RELATED ART

Analog switches are electronic circuits that operate in one of two states, either ON or OFF. The state of the switch is determined by a control voltage or current. In the ON state, an analog switch connects its two signal terminals; in the OFF state, the switch disconnects its two signal terminals. These circuits are used in a wide variety of applications, including track-and-hold circuits, multiplexers, digital-to-analog converters, and programmable-gain amplifiers.

Analog switches are either electromechanical or electronic in nature. Electronic switches are often chosen for their small size and fast switching speed. However they do not offer the low parasitic resistance and capacitance characteristic of many electromechanical devices (relays). Electronic switches can be implemented with a variety of devices, including diodes, BJTs (bipolar junction transistors), JFETs (junction field-effect transistors), and MOSFETs (metal-oxide-semiconductor field-effect transistors). Each type of device offers its own tradeoffs in performance and ease-of-use. BJTs offer a low on-resistance off-capacitance product, and so are useful for switching high-frequency signals. However their voltage-handling capabilities are limited by the reverse breakdown voltage of the base-emitter junction (V(BR)EBO). Certain BJTs are available with higher-than-normal V(BR)EBO, but these inevitably compromise performance in some other area. Other drawbacks of BJT analog switches include high on-leakage current and non-zero offset voltage.

Therefore, an improved analog switch is desired which overcomes the disadvantages of the prior art.

SUMMARY OF THE INVENTION

The present invention comprises an analog switch which uses two BJTs as the switch element. The analog switch of the present invention overcomes the major limitations of analog switches based on a single BJT. The analog switch comprises two connected bipolar junction transistors which are nominally identical devices. The two BJTs are connected in series in opposite directions with their emitters tied together and also preferably with their bases tied together. The collectors of each of the BJTs operate as the two switch terminals. A current source is coupled to the base of each of the bipolar junction transistors. Further, a bias voltage source is connected via a control switch to the base of each of the bipolar junction transistors. A control signal provided to the control switch controls the connection of the voltage source to the bases of the BJTs and hence operates to control the ON/OFF state of the analog switch. A second current source is preferably coupled to the emitters of the BJTs to reduce on-leakage. If the compliance of the second current source is such that it does not turn off when the bases are clamped to the voltage source, then it preferably should be disabled in some other way. The current sources, voltage source, the control switch which connects the voltage source to the bases of the BJTs, and any control switch that disables the emitter current source are collectively referred to as the drive circuit.

In order to turn the analog switch ON, the control signal is generated to turn off the control switch, whereby the voltage source does not supply a voltage. As a result, the drive circuit forces a base-emitter current to flow through both bipolar junction transistors, thus turning the analog switch on. Both bipolar junction transistors are saturated, and the collectors of the bipolar junction transistors are thus electrically coupled.

In order to turn the analog switch OFF, the control signal is generated to turn on the control switch, and the voltage V(off) is applied by the voltage source to the bases of the BJTs. As a result, the drive circuit clamps the base voltage to a voltage level sufficient to reverse bias the base collector junctions of both bipolar junction transistors and preferably disable the emitter current source for all anticipated signal levels. When the base collector junctions of both bipolar junction transistors are reverse biased, the electrical connection between their collectors is broken, and thus the analog switch is off. In one embodiment, the emitters of the BJTs are clamped to this voltage as well for lower feedthrough.

BRIEF DESCRIPTION OF THE DRAWINGS

A better understanding of the present invention can be obtained when the following detailed description is considered in conjunction with the following drawings, in which.

Figure 1:
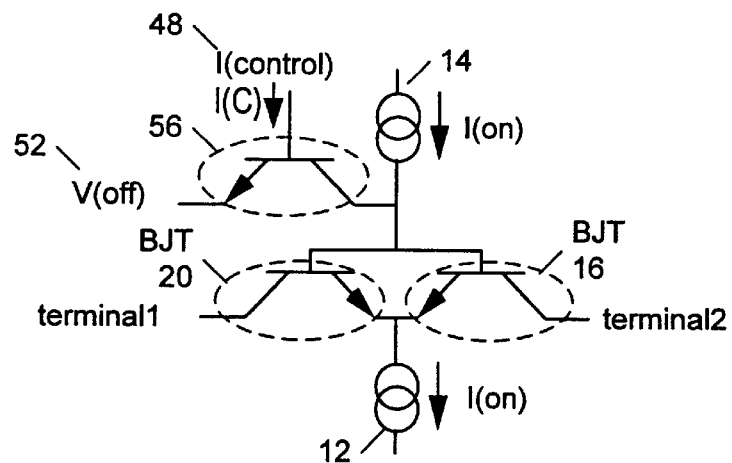
FIG. 1 is a circuit diagram depicting an analog switch using two BJTs according to the present invention, wherein a transistor is used as a control switch between the voltage source and the bases of the BJTs.

While the invention is susceptible to various modifications and alternative forms, specific embodiments are shown by way of example in the drawings and will herein be described in detail. It should be understood however, that drawings and detailed descriptions thereto are not intended to limit the invention to the particular forms disclosed. But on the contrary the invention is to cover all modifications, equivalents and alternatives following within the spirit and scope of the present invention as defined by the appended claims.

DETAILED DESCRIPTION OF THE PREFERRED EMBODIMENT

FIG. 1 is a circuit diagram depicting an analog switch constructed according to the present invention. The analog switch of this embodiment includes two bipolar junction transistors (BJTs) 16 and 20. In the embodiment shown in FIG. 1, a third transistor 56 is preferably used as a control switch to supply control current to the analog switch comprised of BJTs 16 and 20.

In the embodiment of FIG. 1, the emitter of bipolar junction transistor 16 is coupled to the emitter of bipolar junction transistor 20. Also, the base of bipolar junction transistor 16 is coupled to the base of bipolar junction transistor 20. The collector of bipolar junction transistor 16 and the collector of bipolar junction transistor 20 form terminals of the analog switch, referred to as terminal I and terminal 2. Current source 14 is coupled to the base of bipolar junction transistor 16 and the base of bipolar junction transistor 20. Current source 12 is coupled to the emitter of bipolar junction transistor 16 and the emitter of bipolar junction transistor 20. Current sources 14 and 12 force a current I(on) through the base-emitter junction of bipolar junction transistor 16 and through the base-emitter junction of bipolar junction transistor 20.

As mentioned above, transistor 56 is preferably used as a control switch to supply control current to the analog switch comprised of BJTs 16 and 20. The collector of transistor 56 is coupled to each of the bases of BJT 16 and BJT 20. A control current source 48 is coupled to the base of transistor 56. A bias voltage source V(off) 52 is coupled to the emitter of transistor 56. The transistor 56 operates as a control switch to selectively provide a bias voltage from the bias voltage source 52 to the bases of the BJTs 16 and 20, thereby controlling the ON/OFF state of the analog switch.

Figure 4:
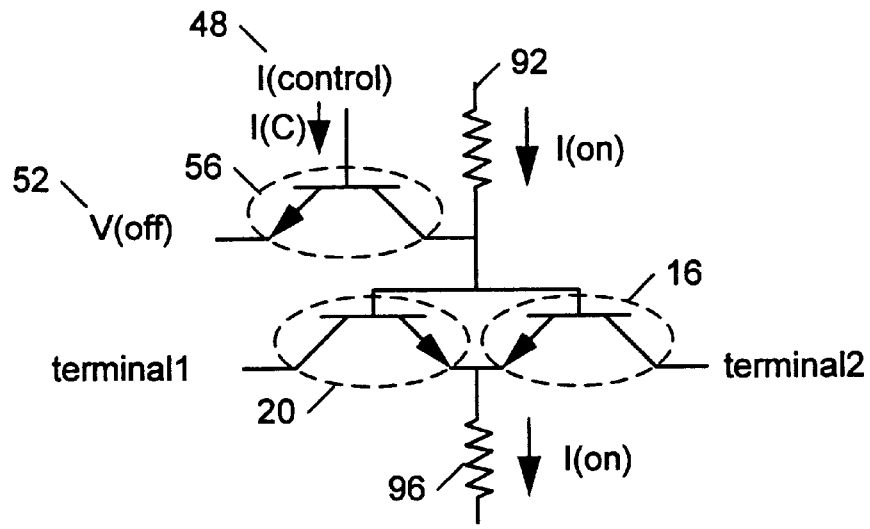
FIG. 4 is a circuit diagram depicting the analog switch of FIG. 1 which uses resistors as the current sources.

In the preferred embodiment, the BJTs 16 and 20 are preferably NPN transistors, although PNP transistors can be used. Transistor 56 is also preferably an NPN BJT. Transistor 56 can, for example, comprise a bipolar junction transistor, a junction field-effect transistor, or a metal-oxide-semiconductor field-effect transistor. Transistor 56 can also be replaced with any of various types of switches. Bias voltage source 52 can comprise a device with a fixed or variable output voltage. Control current source 48 can comprise a device that outputs a fixed or variable current. In a similar fashion, current sources 14 and 12 can each comprise a device that outputs a fixed or variable current. Current sources 14 and 12 may each also comprise a voltage source which provides a voltage across a resistor, as shown in FIG. 4, or may comprise another type of current source.

To turn the analog switch on, control current I(control) 48 is provided to turn off the transistor 56, wherein bias voltage source V(off) 52 is not supplied to the bases of the BJTs. When control current source 48 is switched off, transistor 56 is switched off and bias voltage source 52 is not connected to the base of bipolar junction transistor 16 or the base of bipolar junction transistor 20. As a result, current sources 14 and 12 force current I(on) through base-emitter junction of bipolar junction transistor 16 as well as base-emitter junction of bipolar junction transistor 20. In this manner, a base-emitter current flows through bipolar junction transistor 16 and bipolar junction transistor 20, thus turning the switch on.

To turn the switch off, control current I(control) 48 is provided to turn on the transistor 56, wherein bias voltage source V(off) 52 is supplied. Thus control current source 48 produces control current I(c) which flows into the base of transistor 56, wherein transistor 56 is turned on and bias voltage source 52 is connected to the base of bipolar junction transistor 16 and the base of bipolar junction transistor 20. As a result, transistor 56 is activated to clamp the bases of bipolar junction transistors 16 and 20 to bias voltage source 52. Bias voltage source 52 produces a voltage level sufficient to reverse bias the base-collector junctions for both bipolar junction transistor 20 and bipolar junction transistor 16. Preferably, the voltage is also sufficient to turn off current source 12, or a separate control disables current source 12. In this manner, the base-collector junction of bipolar junction transistors 20 and 16 are reverse biased, thus turning the switch off.

In this manner, control current source 48 controls whether bias voltage source 52 will be connected to the bases of bipolar junction transistor 16 and bipolar junction transistor 20, thus controlling the ON/OFF state of the analog switch.

The embodiment of the present invention depicted in FIG. 1 has numerous advantages, although it has double the on-resistance of a single-BJT switch. The analog switch completely solves the V(BR)EBO problem, and cancels to first order both offset voltage and on-leakage. Thus the analog switch depicted in FIG. 1 has a higher voltage handling capability than a conventional single bipolar junction transistor switch. Since the emitters of bipolar junction transistors 16 and 20 are connected, the voltage handling capabilities of the analog switch are not limited by the reverse breakdown voltage of the base emitter junctions of bipolar junction transistor 20 and bipolar junction transistor 16. The analog switch of the present invention also reduces off capacitance, since it is determined solely by Cbc, which is usually optimized in BJTs, and since the base-collector junctions can be heavily reversed biased. Furthermore, since the circuit in its preferred embodiments forms a tee-switch, it offers very low feedthrough capacitance as well.

Figure 2:
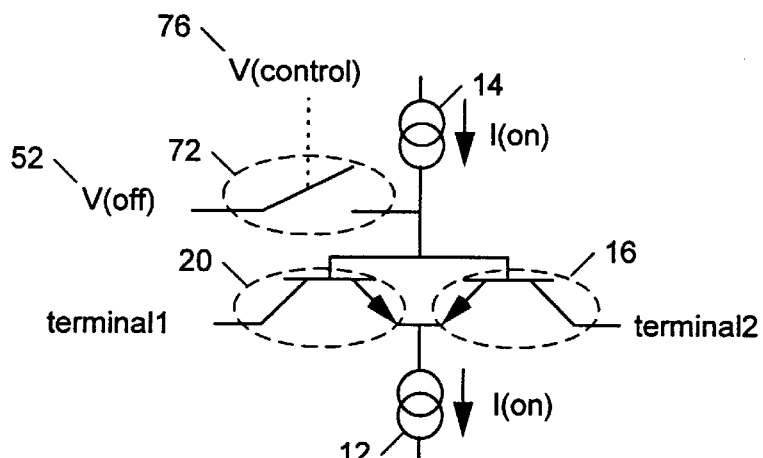
FIG. 2 is a circuit diagram depicting the analog switch of FIG. 1, wherein a generic control switch replaces the transistor between the voltage source and the bases of the BJTs.

FIG. 2 is a circuit diagram depicting an analog switch constructed according to the teachings of the present invention. The analog switch of FIG. 2 is similar to the analog switch shown in FIG. 1, except that the analog switch of FIG. 2 includes a switch 72, which replaces the transistor 56 of FIG. 1. Also, a control voltage V(control) is applied to the switch 72 to control the state of the switch 72. Control voltage 76 can be produced by, for example, a fixed or variable voltage source capable of producing a voltage sufficient to activate switch 72. The operation of the embodiment of the present invention depicted in FIG. 2 is otherwise similar to the operation of the embodiment of the present invention depicted in FIG. 1.

As noted above, the transistor 56 in FIG. 1 used to pull the bases of the BJTs 16 and 20 to V(oft) can be replaced with any other switch, depending on the application. The BJT 56 shown in FIG. 1 is preferred for case of integration and low off-capacitance, which directly contributes to the overall switch's on-capacitance.

Figure 3:
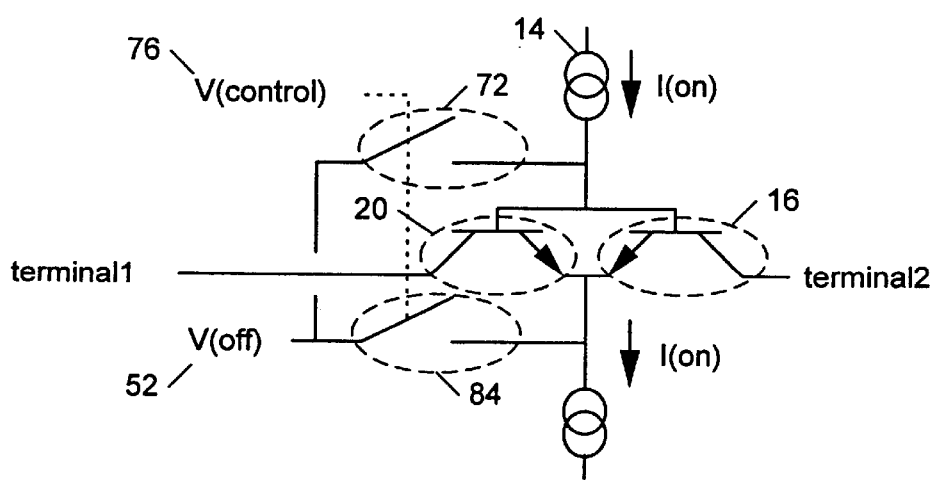
FIG. 3 is a circuit diagram depicting the analog switch of FIG. 2 which further includes voltage clamping for the emitters to reduce off-state feedthrough.

FIG. 3 is a circuit diagram depicting one embodiment of the present invention. The analog switch of FIG. 3 is similar to the analog switches shown in FIGS. 1 and 2, except that the analog switch of FIG. 3 includes a second switch 84 coupled between the voltage source V(off) 52 and the emitters of the BJTs 16 and 20. Also, the control voltage V(control) 76 operates to control both switches 72 and 84. It is noted that the second switch 84 may be any of various types of switches, including a transistor, such as a BJT, etc.

More specifically, in FIG. 3 bias voltage source 52 is connected to a first end of each of switch 72 and switch 84. The second end of switch 72 is further coupled to bases of bipolar junction transistors 20 and 16, and the second end of switch 84 is further coupled to emitters of bipolar junction transistors 20 and 16. Control voltage 76 is coupled to switch 72 and switch 84.

As noted above, when the analog switch is turned OFF, the drive circuit clamps the base voltage to a voltage level sufficient to reverse bias the base-collector junctions for both bipolar junction transistor 20 and bipolar junction transistor 16. In this manner, the base-collector junction of bipolar junction transistors 20 and 16 are reverse biased, thus turning the switch off. In the embodiment of FIG. 3, when the analog switch is turned OFF, the emitters are also clamped to this voltage for lower feedthrough. More specifically, when the analog switch is turned OFF, the switch 84 operates to pull the emitters of the BJTs 16 and 20 to V(off), which operates to further reduce off-state feedthrough. Since both the emitters and bases of bipolar junction transistors 16 and 20 are clamped to a voltage level produced by bias voltage source 52, an open connection is maintained between the collectors of bipolar junction transistors 20 and 16.

The advantages achieved by the embodiment of the present invention described in FIGS. 1 and 2 are also achieved by the embodiment described in FIG. 3.

FIG. 4 is a circuit diagram depicting one embodiment of the present invention. The analog switch of FIG. 4 is similar to the analog switch shown in FIG. 1, except that the analog switch of FIG. 4 includes resistors 92 and 96 which replace the current sources 14 and 12, respectively. The current sources 14 and 12 can be replaced with resistors in applications insensitive to variations in on-leakage with signal voltage.

In the embodiment of FIG. 4, resistor 92 and resistor 96 serve to limit the I(on) current. Resistor 92 and resistor 96 can be sized so that the current I(on) is produced which is sufficient to activate bipolar junction transistor 16 and bipolar junction transistor 20. In this manner, current I(on) forces a current to flow through base-emitter junctions of bipolar junction transistors 20 and 16, thus enabling a connection between collectors of bipolar junction transistors 20 and 16. Resistors 92 and 96 can have different resistive values to produce different I(on) currents. Further, resistors 92 and 96 can comprise, for example, radial lead, axial lead, or surface mount resistor packages constructed of many different resistive materials.

The operation of the circuit depicted in FIG. 4 is otherwise similar to the operation of the circuit depicted in FIG. 1, and the advantages achieved by the embodiment of the present invention described in FIG. 1 are also achieved by the embodiment described in FIG. 4.

Figure 5:
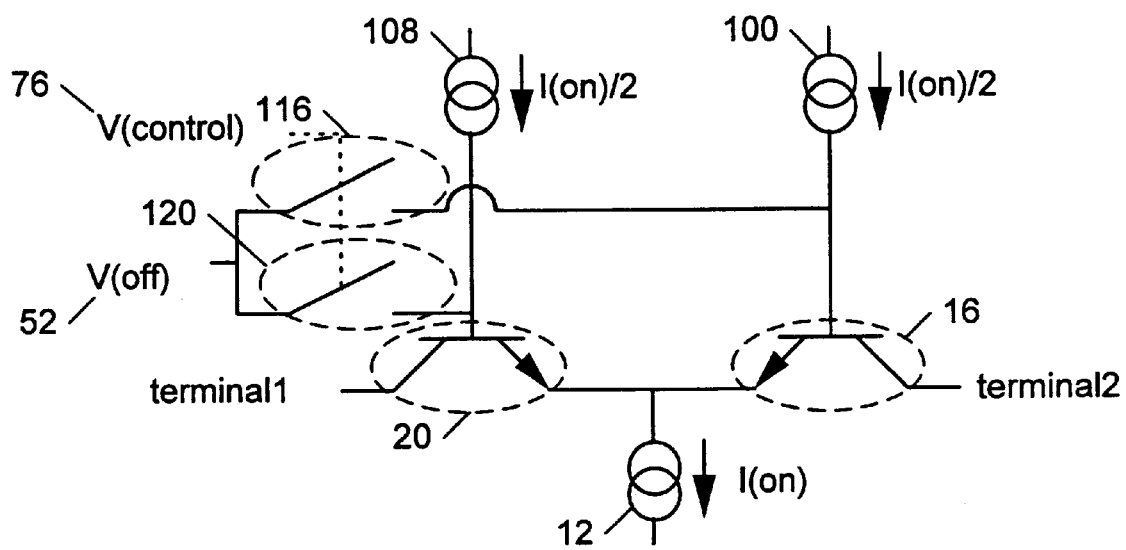
FIG. 5 is a circuit diagram depicting an analog switch of the present invention with separate base drive current sources.

FIG. 5 is a circuit diagram depicting one embodiment of an analog switch of the present invention. In FIG. 5, the emitter of bipolar junction transistor 16 is coupled to the emitter of bipolar junction transistor 20. The base of bipolar junction transistor 16 is coupled to a first current source 100 which produces first drive current I(on)/2. The base of bipolar junction transistor 20 is coupled to second current source 108 which produces second drive current I(on)/2. A third current source 12 is coupled to the emitters of the BJTs 16 and 20. The collectors of bipolar junction transistor 20 and bipolar junction transistor 16 form two terminals of the analog switch. Bias voltage source V(off) 52 is coupled to switch 116 and switch 120. Switch 116 is coupled to the base of bipolar junction transistor 16. Switch 120 is coupled to the base of bipolar junction transistor 20. Control voltage V(control) 124 is coupled to each of the switches 116 and 120 and operates switches 116 and 120.

The operation of the circuit depicted in FIG. 5 is similar to the operation of other embodiments of the present invention previously described. First current source 100 in conjunction with current source 12 produces first drive current I(on)/2 which forces a current through base-emitter junction of bipolar junction transistor 16. In a similar manner, second current source 108 in conjunction with current source 12 produces second drive current I(on)/2 which forces a current through base-emitter junction of bipolar junction transistor 20. The first drive current saturates bipolar junction transistor 16 while the second drive current saturates bipolar junction transistor 20. In this saturated state, the collector of bipolar junction transistor 20 is electrically coupled to collector of bipolar junction transistor 16, and thus the analog switch is on.

In order to break the electrical connection between the collectors of bipolar junction transistor 20 and bipolar junction transistor 16, the bases of bipolar junction transistor 20 and 16 are clamped to a voltage produced by bias voltage source 52. Control voltage 124 preferably activates switch 116 and switch 120 simultaneously to connect bias voltage source 52 with the bases of bipolar junction transistors 20 and 16. When switch 116 and switch 120 couple the bias voltage source 52 to the bases of bipolar junction transistors 20 and 16, the base-collector junctions of each of bipolar junction transistors 20 and 16 are reverse biased. As previously described, the voltage produced by bias voltage source 52 is sufficient to reverse bias bipolar junction transistor 16 and bipolar junction transistor 20, thus turning off the analog switch.

In addition to the previously described advantages, the circuit of FIG. 5 provides additional advantages. Maintaining two different current sources preserves the current balance between bipolar junction transistor 16 and bipolar junction transistor 20. In this manner, bipolar junction transistor 16 and bipolar junction transistor 20 need not be matched transistors. Further, since the base of bipolar junction transistor 20 is not connected to the base of bipolar junction transistor 16, there is no base-coupled capacitive feed through path.

Stated another way, in FIG. 5, the bases are driven with separate current sources and switches. This solves two potential problems: first, if the two transistors composing the switch are not balanced, having separate base drivers will preserve the current balance between them; second, having the bases connected adds a capacitive feedthrough path when the switch is on, resulting in on-impedance that is lower at high frequencies than at low frequencies. Having separate base drivers breaks the connection between the two bases, and the switch exhibits more frequency-independent on-impedance.

Although the system and method of the present invention has been described in connection with several embodiments, it is not intended to be limited to the specific forms set forth herein, but on the contrary, it is intended to cover such alternatives, modifications, and equivalents, as can be reasonably included within the spirit and scope of the invention as defined by the appended claims.

What is claimed is:

1. An analog switch comprising:

a first bipolar junction transistor and a second bipolar junction transistor, wherein an emitter of the first transistor is coupled to an emitter of the second transistor and a base of the first transistor is coupled to a base of the second transistor, wherein a collector of the first transistor comprises a first terminal of the analog switch and a collector of the second transistor comprises a second terminal of the analog switch;

a current source coupled to the base of the first transistor and the base of the second transistor, the current source for producing a base current for the first and second transistors;

a control switch coupled to the current source;

wherein the control switch is controllable to selectively enable current to be provided to the bases of the transistors and place the analog switch in either an on or off state;

a voltage source coupled to the control switch, the voltage source for providing an off voltage to turn off the first and second transistors;

wherein the control switch is controllable to selectively couple the voltage source to the bases of the transistors and place the analog switch in either an on or off state;

wherein the control switch comprises a third transistor with a collector coupled to the base of the first transistor and the base of the second transistor, wherein the voltage source is coupled to the emitter of the third transistor, and wherein a control current source is coupled to the base of the third transistor and operates to control the on/off state of the third transistor and hence the on/off state of the analog switch.

2. The analog switch of claim 1, wherein the voltage source is operable to clamp a base voltage to reverse bias a base-collector junction of the first transistor and a base-collector junction of the second transistor.

3. The analog switch of claim 1, wherein the third transistor comprises a bipolar junction transistor.

4. The analog switch of claim 1, further comprising a second control switch having a first end coupled to the voltage source and having a second end coupled to each of the emitter of the first transistor and the emitter of the second transistor;

wherein the second control switch is controllable to selectively couple the voltage source to the emitters of the transistors to reduce off-state feedthrough.

5. The analog switch of claim 1, further comprising:

an emitter current source coupled to the emitter of the first transistor and the emitter of the second transistor.

6. The analog switch of claim 5, wherein the emitter current source comprises a voltage source applied across a resistor.

7. The analog switch of claim 1, wherein the current source comprises a voltage source applied across a resistor.

8. An analog switch comprising:

a first bipolar junction transistor and a second bipolar junction transistor, wherein an emitter of the first transistor is coupled to an emitter of the second transistor, wherein a collector of the first transistor comprises a first terminal of the analog switch and a collector of the second transistor comprises a second terminal of the analog switch;

a first current source coupled to the base of the first transistor, the first current source for producing a base-emitter current for the first transistor;

a second current source coupled to the base of the second transistor, the second current source for producing a base-emitter current for the second transistor;

control logic coupled to the base of the first transistor and coupled to the base of the second transistor;

wherein the control logic is controllable to selectively enable current to be provided to the base of the first transistor and enable current to be provided to the base of the second transistor to place the analog switch in either an on or off state;

a voltage source coupled to the control logic, wherein the voltage source is operable to clamp a base voltage to reverse bias a base-collector junction of the first and second transistors;

wherein the control logic is controllable to selectively couple a voltage to the bases of the transistors and place the analog switch in either an on or off state.

9. The analog switch of claim 8, further comprising:

a current source coupled to the emitter of the first transistor and the emitter of the second transistor.

10. The analog switch of claim 8, wherein the control logic comprises:

a first control switch coupled to the base of the first transistor, a second control switch coupled to the base of the second transistor, wherein the analog switch further includes:

a voltage source coupled to the first control switch and the second control switch, wherein the voltage source is operable to clamp a base voltage to reverse bias a base-collector junction of the first and second transistors;

wherein the first control switch and the second control switch are controllable to selectively couple a voltage to the bases of the transistors and place the analog switch in either an on or off state.

11. The analog switch of claim 10, wherein the first control switch and the second control switch each comprise a transistor.

12. The analog switch of claim 8, wherein the first and second current sources each comprise a voltage source and a resistor.

13. The analog switch of claim 9, wherein the emitter current source comprises a voltage source and a resistor.

14. An analog switch comprising:

a first bipolar junction transistor and a second bipolar junction transistor, wherein an emitter of the first transistor is coupled to an emitter of the second transistor and a base of the first transistor is coupled to a base of the second transistor, wherein a collector of the first transistor comprises a first terminal of the analog switch and a collector of the second transistor comprises a second terminal of the analog switch;

a current source coupled to the base of the first transistor and the base of the second transistor, the current source for producing a base current for the first and second transistors;

a first control switch coupled to the current source; and wherein the first control switch is controllable to selectively enable current to be provided to the bases of the transistors and place the analog switch in either an on or off state;

a voltage source coupled to the first control switch, the voltage source for providing an off voltage to turn off the first and second transistors;

wherein the control switch is controllable to selectively couple the voltage source to the bases of the transistors and place the analog switch in either an on or off state;

a second control switch having a first end coupled to the voltage source and having a second end coupled to each of the emitter of the first transistor and the emitter of the second transistor;

wherein the second control switch is controllable to selectively couple the voltage source to the emitters of the transistors to reduce off-state feedthrough.

15. The analog switch of claim 14, wherein the voltage source is operable to clamp a base voltage to reverse bias a base-collector junction of the first transistor and a base-collector junction of the second transistor.

16. The analog switch of claim 14, wherein the first control switch comprises:

a third transistor with a collector coupled to the base of the first transistor and the base of the second transistor, wherein the voltage source is coupled to the emitter of the third transistor, and wherein a control current source is coupled to the base of the third transistor and operates to control the on/off state of the third transistor and hence the on/off state of the analog switch.

17. The analog switch of claim 16, wherein the third transistor comprises a bipolar junction transistor.

18. The analog switch of claim 14, further comprising:
an emitter current source coupled to the emitter of the first transistor and the emitter of the second transistor.

19. The analog switch of claim 18, wherein the emitter current source comprises a voltage source applied across a resistor.

20. The analog switch of claim 14, wherein the current source comprises a voltage source applied across a resistor.

21. An analog switch comprising:
a first bipolar junction transistor and a second bipolar junction transistor, wherein an emitter of the first transistor is coupled to an emitter of the second transistor and a base of the first transistor is coupled to a base of the second transistor, wherein a collector of the first transistor comprises a first terminal of the analog switch and a collector of the second transistor comprises a second terminal of the analog switch;
a current source coupled to the base of the first transistor and the base of the second transistor, the current source for producing a base current for the first and second transistors;
a control switch coupled to the current source; and
wherein the control switch is controllable to selectively enable current to be provided to the bases of the transistors and place the analog switch in either an on or off state;
an emitter current source coupled to the emitter of the first transistor and the emitter of the second transistor;
wherein the emitter current source comprises a voltage source applied across a resistor.

22. The analog switch of claim 21, further comprising:
a voltage source coupled to the control switch, the voltage source for providing an off voltage to turn of the first and second transistors;
wherein the control switch is controllable to selectively couple the voltage source to the bases of the transistors and place the analog switch in either an on or off state.

23. The analog switch of claim 22, wherein the voltage source is operable to clamp a base voltage to reverse bias a base-collector junction of the first transistor and a base-collector junction of the second transistor.

24. The analog switch of claim 22, wherein the control switch comprises:
a third transistor with a collector coupled to the base of the first transistor and the base of the second transistor, wherein the voltage source is coupled to the emitter of the third transistor, and
wherein a control current source is coupled to the base of the third transistor and operates to control the on/off state of the third transistor and hence the on/off state of the analog switch.

25. The analog switch of claim 24, wherein the third transistor comprises a bipolar junction transistor.

26. The analog switch of claim 22, further comprising a second control switch having a first end coupled to the voltage source and having a second end coupled to each of the emitter of the first transistor and the emitter of the second transistor;
wherein the second control switch is controllable to selectively couple the voltage source to the emitters of the transistors to reduce off-state feedthrough.

27. An analog switch comprising:
a first bipolar junction transistor and a second bipolar junction transistor, wherein an emitter of the first transistor is coupled to an emitter of the second transistor, wherein a collector of the first transistor comprises a first terminal of the analog switch and a collector of the second transistor comprises a second terminal of the analog switch;
a first current source coupled to the base of the first transistor, the first current source for producing a base-emitter current for the first transistor;
a second current source coupled to the base of the second transistor, the second current source for producing a base-emitter current for the second transistor;
control logic coupled to the base of the first transistor and coupled to the base of the second transistor;
wherein the control logic is controllable to selectively enable current to be provided to the base of the first transistor and enable current to be provided to the base of the second transistor to place the analog switch in either an on or off state;
wherein the control logic comprises:
a first control switch coupled to the base of the first transistor,
a second control switch coupled to the base of the second transistor,
a voltage source coupled to the first control switch and the second control switch, wherein the voltage source is operable to clamp a base voltage to reverse bias a base-collector junction of the first and second transistors;
wherein the first control switch and the second control switch are controllable to selectively couple a voltage to the bases of the transistors and place the analog switch in either an on or off state.

28. The analog switch of claim 27, further comprising:
a voltage source coupled to the control logic, wherein the voltage source is operable to clamp a base voltage to reverse bias a base-collector junction of the first and second transistors;
wherein the control logic is controllable to selectively couple a voltage to the bases of the transistors and place the analog switch in either an on or off state.

29. The analog switch of claim 27, further comprising:
a current source coupled to the emitter of the first transistor and the emitter of the second transistor.

30. The analog switch of claim 27, wherein the first control switch and the second control switch each comprise a transistor.

31. The analog switch of claim 27, wherein the first and second current sources each comprise a voltage source and a resistor.

32. The analog switch of claim 27, further comprising:
an emitter current source coupled to the emitter of the first transistor and the emitter of the second transistor.

33. The analog switch of claim 32, wherein the emitter current source comprises a voltage source and a resistor.

34. The analog switch of claim 27, further comprising a third control switch having a first end coupled to the voltage source and having a second end coupled to each of the emitter of the first transistor and the emitter of the second transistor;
wherein the third control switch is controllable to selectively couple the voltage source to the emitters of the transistors to reduce off-state feedthrough.

35. An analog switch comprising:
a first bipolar junction transistor and a second bipolar junction transistor, wherein an emitter of the first transistor is coupled to an emitter of the second transistor, wherein a collector of the first transistor comprises a first terminal of the analog switch and a collector of the second transistor comprises a second terminal of the analog switch;

a first current source coupled to the base of the first transistor, the first current source for producing a base-emitter current for the first transistor;

a second current source coupled to the base of the second transistor, the second current source for producing a base-emitter current for the second transistor;

control logic coupled to the base of the first transistor and coupled to the base of the second transistor;

wherein the control logic is controllable to selectively enable current to be provided to the base of the first transistor and enable current to be provided to the base of the second transistor to place the analog switch in either an on or off state;

an emitter current source coupled to the emitter of the first transistor and the emitter of the second transistor;

wherein the emitter current source comprises a voltage source and a resistor.

36. The analog switch of claim 35, further comprising:

a voltage source coupled to the control logic, wherein the voltage source is operable to clamp a base voltage to reverse bias a base-collector junction of the first and second transistors;

wherein the control logic is controllable to selectively couple a voltage to the bases of the transistors and place the analog switch in either an on or off state.

37. The analog switch of claim 35, wherein the control logic comprises:

a first control switch coupled to the base of the first transistor, a second control switch coupled to the base of the second transistor, wherein the analog switch further includes:

a voltage source coupled to the first control switch and the second control switch, wherein the voltage source is operable to clamp a base voltage to reverse bias a base-collector junction of the first and second transistors;

wherein the first control switch and the second control switch are controllable to selectively couple a voltage to the bases of the transistors and place the analog switch in either an on or off state.

38. The analog switch of claim 37, wherein the first control switch and the second control switch each comprise a transistor.

39. The analog switch of claim 35, wherein the first and second current sources each comprise a voltage source and a resistor.

* * * * *